US012272745B2

(12) United States Patent
Kato et al.

(10) Patent No.: US 12,272,745 B2
(45) Date of Patent: Apr. 8, 2025

(54) SEMICONDUCTOR DEVICE

(71) Applicants: NATIONAL INSTITUTE OF ADVANCED INDUSTRIAL SCIENCE AND TECHNOLOGY, Tokyo (JP); NATIONAL UNIVERSITY CORPORATION KANAZAWA UNIVERSITY, Ishikawa (JP)

(72) Inventors: Hiromitsu Kato, Ibaraki (JP); Masahiko Ogura, Ibaraki (JP); Toshiharu Makino, Ibaraki (JP); Satoshi Yamasaki, Ibaraki (JP); Tsubasa Matsumoto, Ishikawa (JP); Norio Tokuda, Ishikawa (JP); Takao Inokuma, Ishikawa (JP)

(73) Assignees: NATIONAL INSTITUTE OF ADVANCED INDUSTRIAL SCIENCE AND TECHNOLOGY, Tokyo (JP); NATIONAL UNIVERSITY CORPORATION KANAZAWA UNIVERSITY, Ishikawa (JP)

( * ) Notice: Subject to any disclaimer, the term of this patent is extended or adjusted under 35 U.S.C. 154(b) by 267 days.

(21) Appl. No.: 17/918,809

(22) PCT Filed: Apr. 12, 2021

(86) PCT No.: PCT/JP2021/015212
§ 371 (c)(1),
(2) Date: Oct. 13, 2022

(87) PCT Pub. No.: WO2021/210547
PCT Pub. Date: Oct. 21, 2021

(65) Prior Publication Data
US 2023/0145055 A1     May 11, 2023

(30) Foreign Application Priority Data
Apr. 14, 2020 (JP) .................. 2020-072246

(51) Int. Cl.
H01L 29/78 (2006.01)
H01L 29/16 (2006.01)
H01L 29/41 (2006.01)

(52) U.S. Cl.
CPC .......... H01L 29/78 (2013.01); H01L 29/1602 (2013.01); H01L 29/41 (2013.01)

(58) Field of Classification Search
CPC . H01L 29/7839; H01L 29/78; H01L 29/1602; H01L 29/41; H01L 29/045;
(Continued)

(56) References Cited

U.S. PATENT DOCUMENTS

2009/0020834 A1 * 1/2009 Ootsuka ............ H01L 29/66068
438/278
2014/0288898 A1    9/2014 Fukuda
2018/0358352 A1 * 12/2018 Voldman ............. H01L 27/0255

FOREIGN PATENT DOCUMENTS

JP  H02-188967 A   7/1990
JP  H08-148675 A   6/1996
(Continued)

OTHER PUBLICATIONS

International Search Report issued in Application No. PCT/JP2021/015212, mailed Jul. 6, 2021.
(Continued)

*Primary Examiner* — Wasiul Haider
(74) *Attorney, Agent, or Firm* — Michael Best & Friedrich LLP

(57) ABSTRACT

The present invention provides a novel semiconductor device for high breakdown voltage having no drift layer. The semiconductor device includes a first semiconductor layer of a first conductivity type which is either a p-type or an n-type conductivity type, a source portion arranged so as to be in contact with the first semiconductor layer and configured as a semiconductor portion of a second conductivity type different from the first conductivity type, a source electrode arranged in ohmic contact with the source portion, a gate
(Continued)

electrode arranged on at least one selected from surfaces of the first semiconductor layer via a gate insulating film interposed therebetween and capable of forming by an applied electric field, an inversion layer in a region of the first semiconductor layer near the surface of the first semiconductor layer contacting the gate insulating film, a second semiconductor layer of the first conductivity type arranged so as to be in contact with the inversion layer, and a drain electrode separated from the inversion layer and arranged in Schottky contact with the second semiconductor layer.

8 Claims, 6 Drawing Sheets

(58) Field of Classification Search
CPC ............... H01L 29/1608; H01L 29/24; H01L 29/66045; H01L 29/7827; H01L 29/2003
See application file for complete search history.

(56) References Cited

FOREIGN PATENT DOCUMENTS

| JP | H11-067939 A | 3/1999 |
|----|--------------|--------|
| JP | 2013-004594 A | 1/2013 |
| JP | 2014-187296 A | 10/2014 |
| JP | 2015-106650 A | 6/2015 |
| JP | 2015-118968 A | 6/2015 |
| JP | 2018-006572 A | 1/2018 |
| JP | 2019-212667 A | 12/2019 |

OTHER PUBLICATIONS

Tsubasa Matsumoto et al., "Inversion channel diamond metal-oxide-semiconductor field-effect transistor with normally off characteristics", Scientific Report 6, Article No. 31585, Published Aug. 22, 2016, pp. 1-6, DOI: 10.1038/srep31585, www.nature.com.

S. M. Sze et al., "2.4 Junction Breakdown", Physics of Semiconductor Devices, Apr. 2006, Third Edition, Chapter 2, pp. 102-111, Wiley-Interscience (A John Wiley & Sons, Inc.).

Kenji Fukuda, "The Forefront of Power Device Development", Next-Generation Power Semiconductor, Oct. 2, 2009, Chapter 1, Part 2, pp. 187-249, NTS, Japan.

Kazuo Arai et al., "1.3 Power Device", Fundamentals and Applications of SiC Devices, Mar. 2003, Chapter 1, pp. 27-31, Ohmsha, Japan.

Office Action Issued in Japanese Application No. 2022-515379, dated Jul. 24, 2023.

* cited by examiner

SEMICONDUCTOR DEVICE

TECHNICAL FIELD

The present invention relates to a semiconductor device for high breakdown voltage having no drift layer.

BACKGROUND ART

IGBTs each having low on-resistance and high breakdown voltage are currently used as switching elements for high power.

However, since the IGBT is a bipolar operation element in which minority carriers are involved in conduction, a problem arises in that the switching speed thereof is inferior to that of a unipolar operation element.

On the other hand, as a unipolar operation element represented by a MOSFET, there is a trade-off relationship between the on-resistance and the breakdown voltage. A problem arises in that when a low on-resistance is sought, the breakdown voltage will decrease, and when a high breakdown voltage is sought, the on-resistance will increase (refer to Non-Patent Documents 1 to 3). Hereinafter, this problem will be specifically described.

A typical example of an element structure of a conventional MOSFET element for a power device is shown in FIG. 1.

As shown in FIG. 1, in the MOSFET element 100, a source region 102 of a second conductivity type ($p^+$-type) and a drain region 103 of the second conductivity type ($p^+$-type) are formed in a semiconductor layer 101 of a first conductivity type (n-type). In addition, a drift layer 104 of a second conductivity type ($p^-$-type) lower in impurity concentration than the drain region 103 is formed around the drain region 103.

Further, on the source region 102 and the drain region 103, a source electrode 105 and a drain electrode 106 brought into ohmic contact with these regions are formed respectively.

Further, on the semiconductor layer 101, a gate electrode 108 is arranged at a position between the source region 102 and the drain region 103 via a gate insulating film 107. In the MOSFET element 100, as a voltage is applied to the gate electrode 108, an inversion layer (channel region) 109 having an inverted polarity can be formed so as to cross between the source region 102 and the drift layer 104 in the semiconductor layer 101 immediately below the gate electrode 108.

In the MOSFET element 100, the breakdown voltage can be improved by the drift layer 104, but the on-resistance becomes high because the impurity concentration of the drift layer 104 is low. In addition, the drift layer 104 may be formed large for the purpose of improving the breakdown voltage. However, this also causes a lengthening of a carrier movement path and an increase in on-resistance. The factors that increase these on-resistances are derived from the drift resistance in the drift layer 104. On the other hand, when the impurity concentration in the drift layer 104 is made high and the drift resistance is lowered, the strength of an acting electric field is increased and the breakdown voltage is also lowered.

Therefore, in the conventional MOSFET element having the drift layer, the relationship between the on-resistance derived from the drift resistance and the breakdown voltage is always a trade-off relationship. This will be involved in the problem that when the low on-resistance is sought, the breakdown voltage is lowered, and when the high breakdown voltage is sought, the on-resistance becomes high.

Thus, in order to break through the present situation, it is required to develop a novel semiconductor device for high breakdown voltage, which does not have the drift layer.

Incidentally, the breakdown voltage referred to here means a limit voltage at which the element causes no malfunction or destruction.

PRIOR ART DOCUMENTS

Non-Patent Documents

Non-Patent Document 1: S. M. Sze. "Physics of Semiconductor Devices", Wiley, 3rd Edition (2007)
Non-Patent Document 2: "Next-Generation Power Semiconductors—The Forefront of Device Development for Energy-Saving Society", NTS, ISBN-10: 4860432622, (2009)
Non-Patent Document 3: Kazuo Arai, Sadafumi Yoshida, "Fundamentals and Applications of SiC Devices", (2003), Ohmsha

SUMMARY OF THE INVENTION

Problems to be Solved by the Invention

An object of the present invention is to solve the above-mentioned various problems in the prior art and to provide a novel semiconductor device for high breakdown voltage, which has no drift layer.

Means for Solving the Problems

The means for solving the above-described problems are as follows:

<1> A semiconductor device including a first semiconductor layer of a first conductivity type which is either a p-type or an n-type conductivity type, a source portion arranged so as to be in contact with the first semiconductor layer and configured as a semiconductor portion of a second conductivity type different from the first conductivity type, a source electrode arranged in ohmic contact with the source portion, a gate electrode arranged on at least one selected from surfaces of the first semiconductor layer via a gate insulating film interposed therebetween and capable of forming by an applied electric field, an inversion layer in a region of the first semiconductor layer near the surface of the first semiconductor layer contacting the gate insulating film, a second semiconductor layer of the first conductivity type arranged so as to be in contact with the inversion layer, and a drain electrode separated from the inversion layer and arranged in Schottky contact with the second semiconductor layer.

<2> The semiconductor device described in the above <1>, in which a distance $L_{dg}$ which is the shortest distance between the inversion layer and the drain electrode satisfies the condition of the following formula (1):

[Math. 1]

$$L_{dg} < \sqrt{\frac{2\varepsilon\phi_{bi}}{qN_d}} \quad (1)$$

where, in the formula (1), $\varepsilon$ indicates a dielectric constant of the second semiconductor layer, $\phi_{bi}$ indicates a built-in potential generated between the second semiconductor layer and the Schottky contact drain electrode, q indicates an electron charge, and $N_d$ indicates an impurity concentration in the second semiconductor layer.

<3> The semiconductor device described in either the above <1> or <2>, in which an impurity concentration in the source portion is one digit or more higher than an impurity concentration in the first semiconductor layer.

<4> The semiconductor device described in any one of the above <1> to <3>, in which the source portion is formed as either a layer embedded from one surface of the first semiconductor layer toward the surface side opposite to the one surface or a layer laminated on the one surface, the gate electrode is arranged on the one surface of the first semiconductor layer via the gate insulating film, the second semiconductor layer is formed at a position facing the source portion with the gate electrode and the inversion layer interposed therebetween as either a layer embedded from the one surface of the first semiconductor layer toward the surface side opposite to the one surface or a layer laminated on the one surface, and the drain electrode is arranged on the second semiconductor layer.

<5> The semiconductor device described in any one of the above <1> to <3>, in which the source portion is formed as a layer on which the source electrode is arranged on one surface of the source portion, the first semiconductor layer is formed so as to be laminated on the surface of the layer opposite to the one surface and to have a through hole passing from the laminated surface with the layer to the surface opposite to the laminated surface, the second semiconductor layer and the drain electrode are arranged in this order on the opposite surface of the first semiconductor layer, and the gate electrode is arranged in the through hole in a state in which a contact surface with the first semiconductor layer and the layer is covered with the gate insulating film.

<6> The semiconductor device described in any one of the above <1> to <5>, in which the first semiconductor layer and the second semiconductor layer are formed as one layer with the same semiconductor material and impurity concentration.

<7> The semiconductor device described in any one of the above <1> to <6>, in which at least one of the first semiconductor layer, the second semiconductor layer, and the source portion is formed of a wide-gap semiconductor forming material having a band gap larger than that of silicon.

<8> The semiconductor device described in the above <7>, in which the wide-gap semiconductor forming material is diamond.

<9> The semiconductor device described in the above <8>, in which the source portion is formed of diamond and has hopping conductivity.

Advantageous Effect of the Invention

According to the present invention, it is possible to solve the above-mentioned various problems in the prior art and to provide a novel semiconductor device for high breakdown voltage, which does not have the drift layer.

BRIEF DESCRIPTION OF THE DRAWINGS

FIG. 2(b) is a sectional view showing a state when the planar MOSFET element is turned on.

Figure 1:
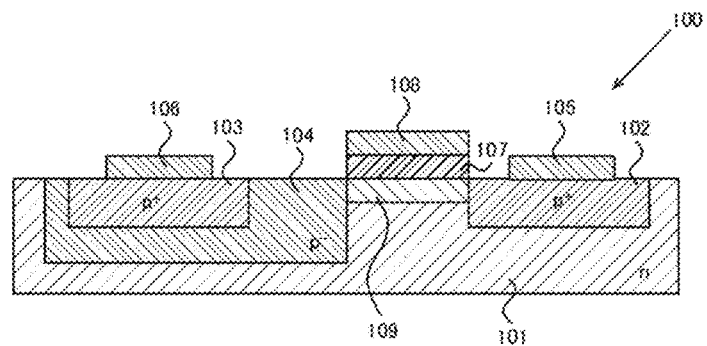
FIG. 1 is a sectional view showing a typical example of an element structure of a MOSFET element for a conventional power device.

MODE FOR CARRYING OUT THE INVENTION (Semiconductor Device)

A semiconductor device of the present invention includes a first semiconductor layer, a source portion, a source electrode, a second semiconductor layer, a drain electrode, and a gate electrode.

The semiconductor device does not have a drain region 103 (refer to FIG. 1) in a conventional MOSFET element 100, and operates on a different principle. Further, the semiconductor device does not have a drift layer 104 (refer to FIG. 1) in the conventional MOSFET element 100, and therefore its on-resistance is not affected by a drift resistance.

Hereinafter, each part of the semiconductor device will first be described, and then the operating principle of the semiconductor device will be described in detail with reference to the accompanying drawings along with specific illustrations of embodiments.

<First Semiconductor Layer>

The first semiconductor layer is configured as a semiconductor layer of a first conductivity type which is either a p-type or an n-type. The first semiconductor layer is made into the conductivity type by introducing an impurity substance of either a p-type impurity substance or an n-type impurity substance.

As the p-type impurity substance, there is no limitation in particular and the known substances can be applied. The p-type impurity substance typically includes boron. Further, as the n-type impurity substance, there is no particular limitation and the known substances can be applied. The n-type impurity substance typically includes phosphorus or nitrogen.

The impurity concentration in the first semiconductor layer is not particularly limited, but is preferably about $1\times10^{11}$ cm$^{-3}$ to $1\times10^{18}$ cm$^{-3}$.

The material for forming the first semiconductor layer is not particularly limited, and may include a known semiconductor material containing silicon and germanium, but from the viewpoint of application to a power device, it may preferably be a material forming a wide gap semiconductor, having a band gap larger than that of the silicon. That is, in the semiconductor device, the on-resistance is not affected by the drift resistance, and the semiconductor material can be selected considering the breakdown voltage exclusively. Therefore, the application of the wide gap semiconductor to the power device is suitable.

The wide bandgap semiconductor forming material is not particularly limited, and may be appropriately selected depending on the purpose. The wide bandgap semiconductor forming material may include silicon carbide (SiC), gallium nitride (GaN), diamond and the like, but above all, may preferably be diamond which is also excellent in the melting point, thermal conductivity, dielectric breakdown resistance, carrier velocity limit, hardness/elastic modulus, chemical stability, and radiation resistance in addition to the widegap characteristics.

The first semiconductor layer is not particularly limited, and may be comprised of a known semiconductor substrate or the like.

Further, a method of forming the first semiconductor layer is not particularly limited, and can be appropriately selected from known forming methods depending on the forming material. Incidentally, when the first semiconductor layer is the diamond, a method of forming it on a diamond substrate by the plasma vapor phase deposition method described in Japanese Patent Application Laid-Open No. 2018-006572 is preferable.

Incidentally, when the first semiconductor layer is formed with a through hole to be described later, a method of forming the through hole is not particularly limited, and may include a known lithography processing method.

<Source Portion>

The source portion is arranged so as to be in contact with the first semiconductor layer, and is configured as a semiconductor portion whose conductivity type is of a second conductivity type different from the first conductivity type.

The material for forming the source portion may include the same forming material as the material for forming the first semiconductor layer. Further, as the impurity substance in the source portion, there can be used one opposite in polarity to the first semiconductor layer.

The impurity concentration in the source portion is not particularly limited, but is preferably one digit or more higher than the impurity concentration in the first semiconductor layer, and specifically, is preferably about $1\times10^{19}$ cm$^{-3}$ to $1\times10^{22}$ cm$^{-3}$. When the impurity concentration in the source portion is made higher than that of the first semiconductor layer, it is possible to reduce the resistance in the source portion.

A method of forming the source portion is not particularly limited, and can be appropriately selected from known forming methods depending on the forming material.

A typical forming method may include a known ion implantation method. That is, the source portion can be formed as a layer embedded from one surface of the first semiconductor layer toward the surface side opposite to the one surface as in the known source region.

Further, when the source portion is formed of a forming material (the diamond or the like) to which the ion implantation method is difficult to apply, it may be formed as a layer laminated on the one surface of the first semiconductor layer. In this case, it can be formed by the plasma vapor deposition method described in Japanese Patent Application Laid-Open No. 2018-006572 and the lithography processing method.

In addition, the source portion may take a layered shape depending on the element structure of the semiconductor device regardless of the forming material.

Furthermore, when the source portion is formed of the diamond, it is preferable that the source portion has hopping conductivity from the viewpoint of reducing the resistance of the source portion. The hopping conductivity is exhibited by setting the impurity concentration in the source portion formed of the diamond to $1\times10^{19}$ cm$^{-3}$ or more.

<Source Electrode>

The source electrode is arranged in ohmic contact with the source portion.

The material for forming the source electrode is not particularly limited, and may include known electrode materials such as titanium, aluminum, nickel, molybdenum, tungsten, tantalum, platinum, gold, an alloy containing these elements, and carbides, nitrides and silicides of these elements. When the source portion is formed of the diamond, titanium, platinum, gold and a laminate of these metals are preferable.

The method of forming the source electrode is not particularly limited, and may include a vacuum deposition method, a CVD method, an ALD method, etc. which are well known.

Incidentally, the method of forming the source portion and the source electrode in the case where the source portion is formed of the diamond can be appropriately selected from known forming methods. This method may include, for example, the method described in Japanese Patent No. 6341477, etc.

<Gate Electrode>

The gate electrode is arranged on any surface of the first semiconductor layer via a gate insulating film, and is capable of forming, by an applied electric field, an inversion layer in a region of the first semiconductor layer near a contact surface with the gate insulating film.

The material for forming the gate insulating film is not particularly limited, and may be appropriately selected depending on the purpose. The gate insulating film forming material may include known forming materials such as $SiO_2$, $HfO_2$, $Al_2O_3$, and $ZrO_2$. In particular, when the first semiconductor layer is formed of the diamond, $Al_2O_3$ is preferable. When $Al_2O_3$ is used, it is possible to reduce an interface level density that is a defect level between it and the diamond, and to suitably induce the inversion layer with respect to the first semiconductor layer (refer to, for example, Japanese Patent Application Laid-Open No. 2018-006572, and the following reference Document 1).

Further, the method of forming the gate insulating film is not particularly limited, and may be appropriately selected depending on the purpose. The method of forming the gate insulating film may include, for example, an ALD method, a sputtering method, a CVD method, etc. using the forming material.

Reference Document 1: T. Matsumoto et al., "Inversion channel diamond metal oxide-semiconductor field-effect transistor with normally off characteristics", Scientific Reports, 6, 31585 (2016).

The material for forming the gate electrode is not particularly limited, and may include known electrode materials such as titanium, aluminum, nickel, molybdenum, tungsten, tantalum, platinum, gold, an alloy containing these elements, and carbides, nitrides and silicides of these elements.

Further, the method of forming the gate electrode is not particularly limited, and may be appropriately selected depending on the purpose. The gate electrode forming method may include, for example, a sputtering method and a CVD method.

<Second Semiconductor Layer>

The second semiconductor layer is configured as a semiconductor layer of the first conductivity type arranged so as to be in contact with the inversion layer.

The impurity concentration in the second semiconductor layer is not particularly limited, but in the same way as the first semiconductor layer, it is preferably an impurity concentration selected from the range of about $1\times10^{11}$ cm$^{-3}$ to $1\times10^{18}$ cm$^{-3}$. In the second semiconductor layer, when the impurity concentration is too low, the width of a depletion layer generated in the second semiconductor layer from the drain electrode in Schottky contact may become wide and hence the device may increase in size. When the impurity concentration is too high, the width of the depletion layer may become narrow, so that the second semiconductor layer may be difficult to process. Incidentally, the depletion layer will be described later together with the description of the first embodiment referring to the drawings.

The material for forming the second semiconductor layer may include the same forming material as the material for forming the first semiconductor layer.

The second semiconductor layer is a layer in which the impurity concentration can be set independently of the first semiconductor layer of the same conductivity type, but is preferably one region in the first semiconductor layer common in impurity concentration to the first semiconductor layer in the manufacturing step. That is, it is preferable that the first semiconductor layer and the second semiconductor layer are formed as one layer with the same semiconductor material and impurity concentration. In the case of forming them in this way, the manufacturing step of making the first semiconductor layer itself in common use as the second semiconductor layer and forming the second semiconductor layer as a semiconductor layer different from the first semiconductor layer can be omitted.

The forming method when the second semiconductor layer is formed as the semiconductor layer different from the first semiconductor layer is not particularly limited, and a known semiconductor layer forming method and a known lithography processing method can be applied.

<Drain Electrode>

The drain electrode is separated from the inversion layer and arranged in Schottky contact with the second semiconductor layer.

In the semiconductor device, the contact between the source portion and the source electrode is defined as the ohmic contact, and the contact between the second semiconductor layer (the first semiconductor layer when the second semiconductor layer is formed by the first semiconductor layer itself) and the drain electrode is defined as the Schottky contact. Consequently, the semiconductor device operates on a principle different from that of the conventional MOSFET element (refer to, for example FIG. 1).

The material for forming the drain electrode is not particularly limited, and may include known electrode materials such as titanium, aluminum, nickel, molybdenum, tungsten, tantalum, platinum, gold, an alloy containing these elements, and carbides, nitrides and silicides of these elements. When the source portion is formed of the diamond, titanium, platinum, gold and a laminate of these metals are preferable.

Further, the method of forming the drain electrode is not particularly limited, and may include a vacuum deposition method, a CVD method, an ALD method, etc., which are well known.

Hereinafter, embodiments of the present invention will be described with reference to the accompanying drawings. Incidentally, the technical idea of the present invention is not limited to these embodiments, and can be widely applied to a unipolar-operated transistor and the like formed of a wide bandgap semiconductor and the like.

First Embodiment

Figure 2A:
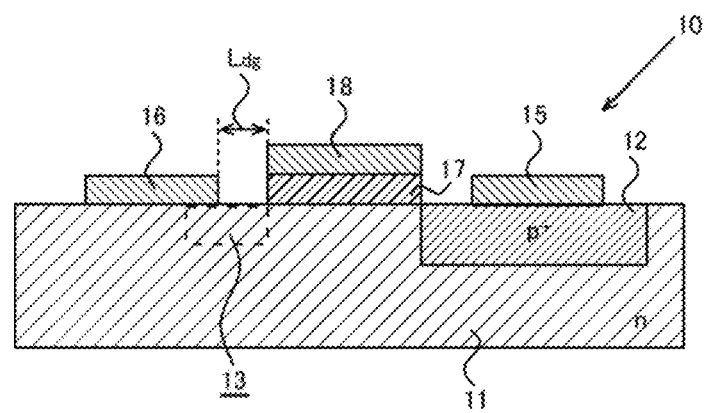
FIG. 2(a) is a sectional view showing a state when a planar MOSFET element is turned off.
Figure 2B:
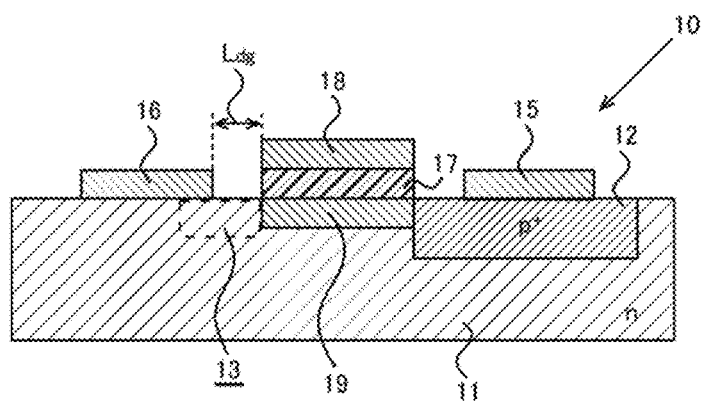

A semiconductor device according to a first embodiment is shown in FIGS. 2(a) and 2(b). As the semiconductor device according to the first embodiment, there is shown a configuration example as a planar MOSFET element. Incidentally, FIG. 2(a) is a sectional view showing a state when the planar MOSFET element is off, and FIG. 2(b) is a sectional view showing a state when the planar MOSFET element is on.

As shown in FIGS. 2(a) and 2(b), the MOSFET element 10 has a first semiconductor layer 11 whose conductivity type is an n-type, a source portion 12 arranged so as to be in contact with the first semiconductor layer 11 and whose conductivity type is a p$^+$-type, a source electrode 15 arranged in ohmic contact with the source portion 12, a gate electrode 18 arranged on one surface of the first semiconductor layer 11 via a gate insulating film 17, and a drain electrode 16 arranged in Schottky contact with the second semiconductor layer 13.

The source portion 12 is formed as a layer embedded from the one surface of the first semiconductor layer 11 toward the surface side opposite to the one surface. The source portion 12 is set higher in impurity concentration than the first semiconductor layer 11 (p$^+$ layer) and formed so as to obtain ohmic contact with the source electrode 15. Further, the source portion 12 is formed at a position where it can come into contact with an inversion layer 19.

On the other hand, the Schottky-contact drain electrode 16 is arranged so as to be separated from the inversion layer 19 (refer to FIG. 2(b)) formed in the first semiconductor layer 11 immediately below the gate electrode 18. Incidentally, "$L_{dg}$" in the figure indicates the shortest distance between the inversion layer 19 and the drain electrode 16, and the drain electrode 16 is separated from the inversion layer 19 by a distance of $L_{dg}$.

This distance $L_{dg}$ can be substantially regarded as the distance between a first contact position being a contact position with the second semiconductor layer 13 (first semiconductor layer 11) at the side surface of the drain electrode 16 on the side facing the gate electrode 18, and when a contact position with the gate insulating film 17 at the side surface of the gate electrode 18 on the side facing the drain electrode 16 is taken as a second contact position, the opposite position of the inversion layer 19 facing the second contact position at the shortest distance, i.e., the distance between the drain electrode 16 and the gate electrode 18. The distance $L_{dg}$ can also be treated as the distance between the drain electrode 16 and the gate electrode 18 in design.

The second semiconductor layer 13 is taken as a region of the first semiconductor layer 11 itself, and is formed as one layer with the same semiconductor material and impurity concentration as the first semiconductor layer 11. The second semiconductor layer 13 corresponds to a region of the first semiconductor layer 11 having a region on the shortest path from the inversion layer 19 formed in the first semiconductor layer 11 immediately below the gate electrode 18 to the drain electrode 16 as a main region. The drain electrode 16 is arranged on this region (refer to FIG. 2(b)).

As can be understood from the comparison between FIG. 1 and FIGS. 2(a) and 2(b), the MOSFET element 10 is different from the conventional MOSFET element 100 in that there are no formed portions corresponding to the drain region 103 and the drift layer 104, and the ohmic contact source electrode 15 and the Schottky contact drain electrode 16 have electrodes different in contact characteristics.

This difference is based on the fact that the MOSFET element 10 operates on an operating principle different from that of the conventional MOSFET element 100. Hereinafter, the operating principle of the MOSFET element 10 will be described with reference to FIGS. 3(a) and 3(b).

Figure 3A:
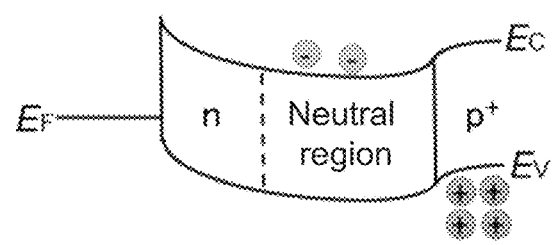
FIG. 3(a) is a view showing an energy band diagram at the time of off between a drain electrode and a source electrode in a MOSFET element placed in a thermal equilibrium state.

FIG. 3(a) is a view showing an energy band diagram at the time of off between the drain electrode 16 and the source electrode 15 of the MOSFET element 10 placed in a thermal equilibrium state.

As shown in the figure, at the off time, a first depletion layer is formed by the Schottky junction between the drain electrode 16 and the second semiconductor layer 13 (first semiconductor layer 11). Further, a second depletion layer is formed in the first semiconductor layer 11 by the pn junction between the source portion 12 and the first semiconductor layer 11. These first and second depletion layers are not in contact with each other and exist in isolation by a neutral region of the first semiconductor layer 11.

When no voltage is applied to the gate electrode 18, the deflection of a downward band formed by the neutral region blocks the movement of positive holes (indicated by "+" in the figure) in the source portion 12, thereby resulting in an off state in which no current flows. Even if a forward voltage is applied to the drain electrode 16, the positive holes existing in the valence band of the $p^+$ layer of the source portion 12 flow into the n layer of the first semiconductor layer 11, and disappear as a result of recombination with electrons (indicated by "−" in the figure).

Thus, the positive holes in the source portion 12 cannot reach the drain electrode 16, and as a result, the first semiconductor layer 11 acts as an insulator against the positive holes which are majority carriers.

Figure 3B:
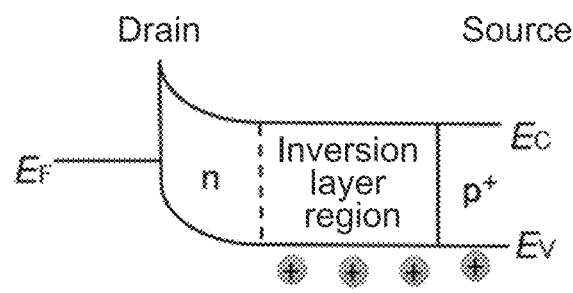
FIG. 3(b) is a view showing an energy band diagram at the time of on between the drain electrode and the source electrode in the MOSFET element placed in the thermal equilibrium state.

FIG. 3(b) is a view showing an energy band diagram at the time of on between the drain electrode 16 and the source electrode 15 in the MOSFET element 10 placed in the thermal equilibrium state.

As shown in the figure, when a voltage is applied to the gate electrode 18 to turn it on, the inversion layer 19 is formed at a position directly below the gate insulating layer 17 in the first semiconductor layer 11, and hence the neutral region disappears.

At this time, when a forward voltage is applied to the drain electrode 16, positive holes existing in the valence band of the source portion 12 flow into the second semiconductor layer 13 via the inversion layer 19 and reaches the drain electrode 16 by an internal electric field of the second semiconductor layer 13. That is, a drain current flows.

Further, at this time, the first depletion layer formed in the second semiconductor layer 13 by the Schottky contact of the drain electrode 16 comes into contact with the inversion layer 19, but it is preferable that the distance $L_{dg}$ between the drain electrode 16 and the gate electrode 18 satisfies the condition of the following formula (1) from the viewpoint that the drain current is made to flow between the inversion layer 19 and the drain electrode 16 via the second semiconductor layer 13 (the region where the first depletion layer is formed).

In addition, when the condition of the following formula (1) is satisfied, the first depletion layer is completely depleted, and the second semiconductor layer 13 which is the forming region of the first depletion layer, becomes a good conductor for the positive holes, and the on-resistance thereof is significantly reduced.

[Math. 2]

$$L_{dg} < \sqrt{\frac{2\varepsilon\phi_{bi}}{qN_d}} \quad (1)$$

However, in the formula (1), ε indicates a dielectric constant of the second semiconductor layer 13 (first semiconductor layer 11), and $\phi_{bi}$ indicates a built-in potential generated between the second semiconductor layer 13 (first semiconductor layer 11) and the Schottky-contact drain electrode 16, q indicates an electron charge, and $N_d$ indicates an impurity concentration in the second semiconductor layer 13 (first semiconductor layer 11).

As described above, the MOSFET element 10 which is the semiconductor device according to the first embodiment of the present invention does not have the drift layer 104 (refer to FIG. 1) in the conventional MOSFET element 100, and the on-resistance thereof is made drift resistance-free.

Figure 4:
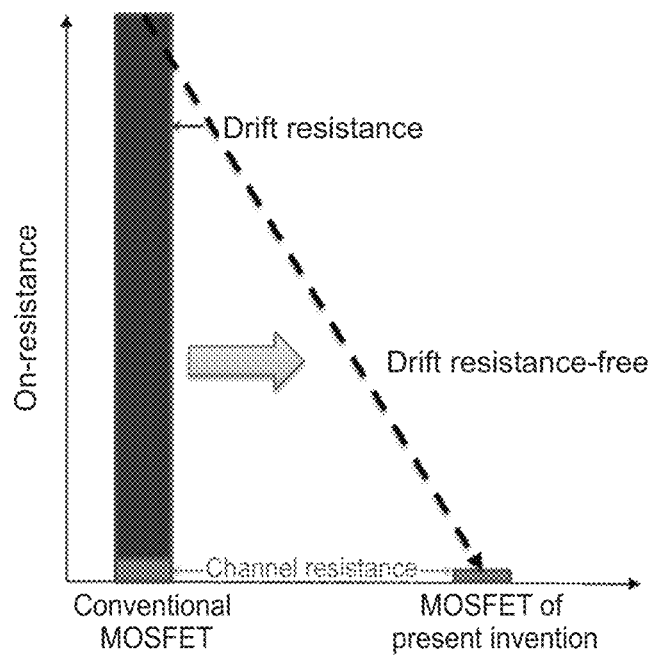
FIG. 4 is an explanatory view for comparing and describing the on-resistance of a conventional MOSFET and the on-resistance of a MOSFET of the present invention.

Therefore, as shown in FIG. 4, according to the MOSFET element 10 which is the semiconductor device according to the first embodiment of the present invention, the on-resistance can be remarkably reduced. Incidentally, FIG. 4 is an explanatory view for comparing and explaining the on-resistance of the conventional MOSFET and the on-resistance of the MOSFET of the present invention.

Further, in the MOSFET element 10 which is the semiconductor device according to the first embodiment of the present invention, since the on-resistance depends on the channel resistance (resistance in the inversion layer 19), the slope of the characteristics shown linearly on the double logarithmic graph between the on-resistance and the breakdown voltage becomes gentler than the slope of the characteristics in the current MOSFET element in which the on-resistance depends on the drift resistance.

Figure 5:
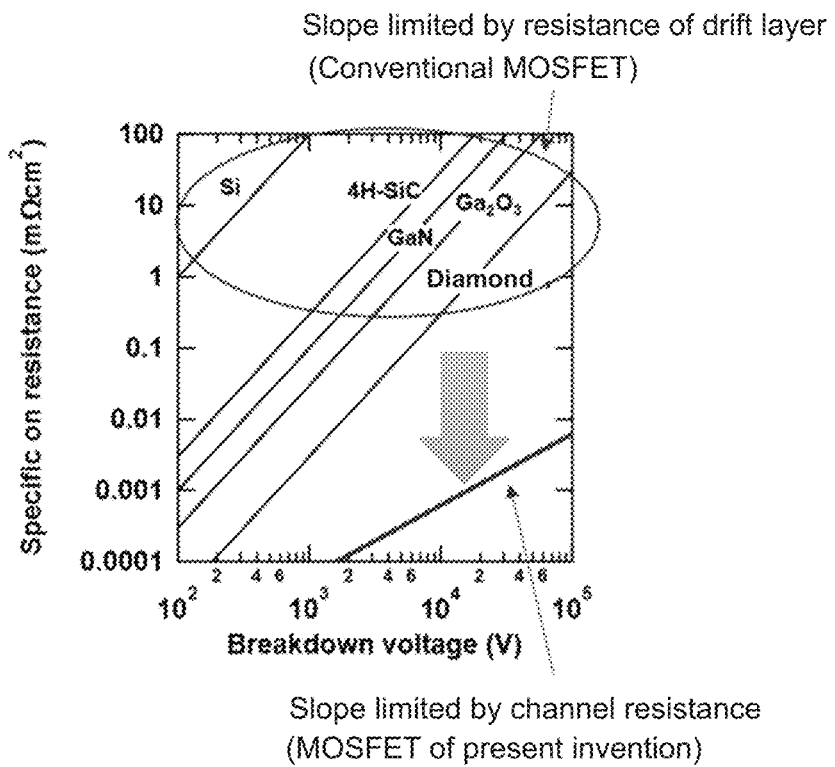
FIG. 5 is an explanatory view for comparing and describing the slope of characteristics shown linearly on a double logarithmic graph between the on-resistance and breakdown voltage of the current MOSFET having a drift layer, and the slope of the characteristics in the MOSFET of the present invention.

Therefore, as shown in FIG. 5, according to the element structure of the MOSFET element 10 which is the semiconductor device according to the first embodiment of the present invention, it is possible to achieve on-resistance-lowering and higher breakdown voltage of the semiconductor device formed of the same semiconductor material regardless of whether the semiconductor material is any of Si, 4H-SiC, GaN, $Ga_2O_3$ and diamond. Incidentally, FIG. 5 is an explanatory view for comparing and describing the slope of the characteristics shown linearly on the double logarithmic graph between the on-resistance and the breakdown voltage in the current MOSFET having the drift layer and the slope of the characteristics in the MOSFET of the present invention.

Incidentally, in order to change the element configuration of the MOSFET element 10 for a p-channel type operation and allow it to perform an n-channel type operation, the conductivity type of the first semiconductor layer 11 is changed from the n-type to the p-type. Further, the conductivity type of the source unit 12 is changed from the p-type to the n-type to form an n$^+$-type semiconductor layer, and the polarity of the applied voltage is reversed with respect to the p-channel type operation. The MOSFET element for the n-channel type operation configured in this way becomes operable according to the operating principle common to the operating principle described with reference to FIGS. 3(*a*) and 3(*b*) except that majority carriers change from positive holes to electrons.

Further, the operating principle described with reference to FIGS. 3(*a*) and 3(*b*) can be applied to the semiconductor device formed of a semiconductor material (e.g., diamond) at a position where the energy levels (donor level, acceptor level) of the conductive impurities in the first semiconductor layer are sufficiently deeper than thermal excitation energy corresponding to the operating temperature of the semiconductor device, but is applicable even to the semiconductor device formed of a semiconductor material (for example, silicon) having a shallow impurity level at room temperature by operating it at a low temperature at which the thermal excitation energy becomes sufficiently low.

Second Embodiment

Figure 6:
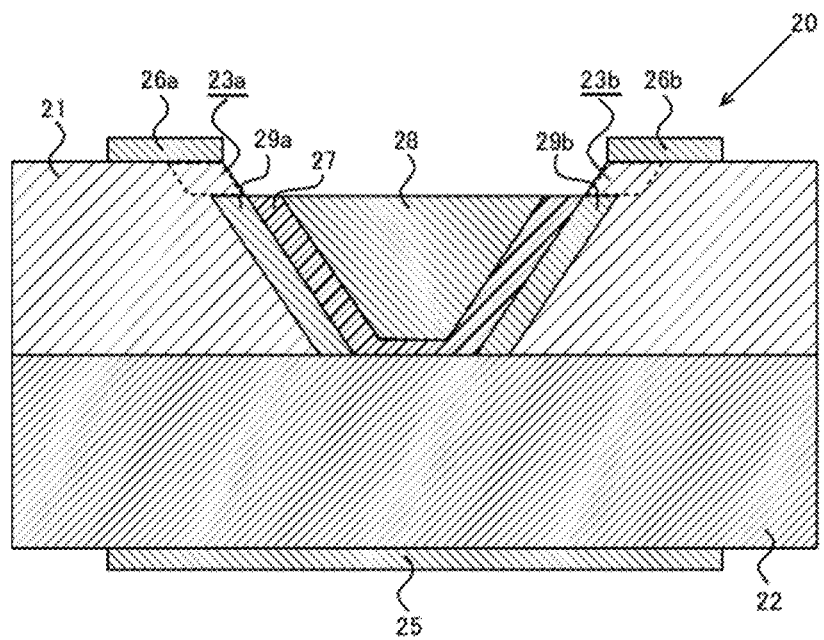
FIG. 6 is a sectional view showing an element structure of a vertical MOSFET element.

Next, a semiconductor device according to a second embodiment is shown in FIG. 6. As the semiconductor device according to the second embodiment, there is shown a configuration example as a vertical MOSFET element. Incidentally, FIG. 6 is a sectional view showing an element structure of the vertical MOSFET element.

As shown in FIG. 6, the MOSFET element 20 has a first semiconductor layer 21 whose conductivity type is an n-type, a source portion 22 arranged so as to be in contact with the first semiconductor layer 21 and formed as a source semiconductor layer whose conductivity type is a p-type, a source electrode 25 arranged in ohmic contact with the source portion 22, a gate electrode 28 arranged on one surface of the first semiconductor layer 21 via a gate insulating film 27, and drain electrodes 26*a* and 26*b* arranged in Schottky contact with second semiconductor layers 23*a* and 23*b*.

The second semiconductor layers 23*a* and 23*b* are defined as one region of the first semiconductor layer 21 itself and formed as one layer with the same semiconductor material and impurity concentration as the first semiconductor layer 21. The second semiconductor layers 23*a* and 23*b* correspond to one region of the first semiconductor layer 21 having a region on the shortest path from an inversion layer 29*a* formed near the contact surface with the gate insulating film 27 in the first semiconductor layer 21 to the drain electrode 26*a* as a main region, and another region of the first semiconductor layer 21 having a region on the shortest path from an inversion layer 29*b* to the drain electrode 26*b* as a main region in the same manner, and the drain electrodes 26*a* and 26*b* are arranged on these regions.

In the MOSFET element 20, the source portion 22 is formed as a layer on which the source electrode 25 is arranged on one surface. The first semiconductor layer 21 is laminated on the surface of the source portion 22 opposite to the one surface and formed so as to have a through hole passing from the laminated surface with the source portion 22 to the surface opposite to the laminated surface.

Further, the drain electrodes 26*a* and 26*b* are arranged on the opposite surface of the first semiconductor layer 21. In the present embodiment as described above, the first semiconductor layer 21 itself also serves as the second semiconductor layer 23*a* (23*b*), and the second semiconductor layer 23*a* (23*b*) corresponds to the region of the first semiconductor layer 21 having the region on the shortest path extending from the inversion layer 29*a* (29*b*) to the drain electrode 26*a* (26*b*) as the main region. Therefore, the second semiconductor layer 23*a* (23*b*) and the drain electrode 26*a* (26*b*) are configured to be arranged in this order substantially on the first semiconductor layer 21 at the upper end position of the inversion layer 29*a* (29*b*).

In addition, the gate electrode 28 is arranged in the through hole in a state where the contact surface with the first semiconductor layer 21 and the source portion 22 is covered with the gate insulating film 27.

Even in the MOSFET element 20 which is the semiconductor device according to the second embodiment of the present invention configured in this way, the operating principle of the MOSFET element 10 described using FIGS. 3(*a*) and 3(*b*) can be applied only by replacing the positional relationship between the p-type region and the n-type region in the vertical direction, thereby making it possible to obtain the above-mentioned drift resistance-free semiconductor device for high breakdown voltage.

Incidentally, although the MOSFET element 20 has been described as the p-channel type operation, it is also possible to use it as a semiconductor device having an n-channel type operation by reversing the relationship between the p-type and the n-type in the MOSFET element 20.

Third Embodiment

Figure 7:
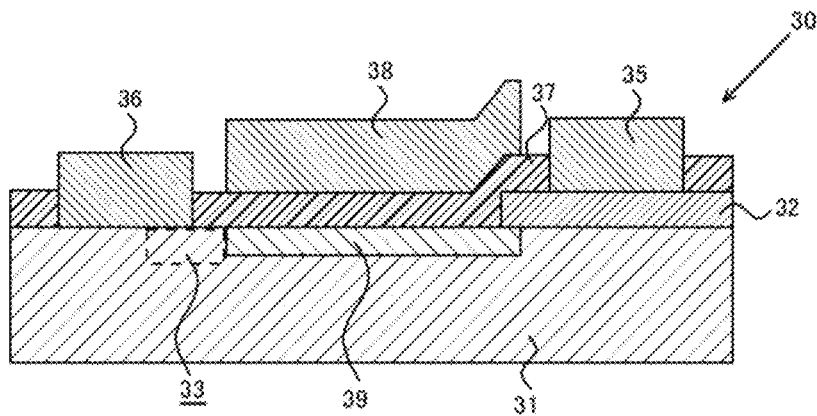
FIG. 7 is a sectional view showing an element structure of a planar MOSFET element formed by using a diamond semiconductor.

Next, a semiconductor device according to a third embodiment is shown in FIG. 7. As the semiconductor device according to the third embodiment, there is shown a configuration example as a planar MOSFET element formed by using a diamond semiconductor. Incidentally, FIG. 7 is a sectional view showing an element structure of the planar MOSFET element formed by using the diamond semiconductor.

As shown in FIG. 7, the MOSFET element 30 includes a first semiconductor layer 31 of a first conductivity type, a source portion 32 of a second conductivity type arranged so as to be in contact with the first semiconductor layer 31, a source electrode 35 arranged in ohmic contact with the source portion 32, a gate electrode 38 arranged on one surface of the first semiconductor layer 31 via a gate insulating film 37, and a drain electrode 36 arranged in Schottky contact with a second semiconductor layer 33.

The second semiconductor layer 33 is defined as a region of the first semiconductor layer 31 itself and formed as one layer with the same semiconductor material and impurity concentration as the first semiconductor layer 31. The second semiconductor layer 33 corresponds to a region of the first semiconductor layer 31 having as a main region, a region on the shortest path extending from an inversion layer 39 formed in the first semiconductor layer 31 directly below the gate electrode 38 to the drain electrode 36. The drain electrode 36 is arranged on this region.

In the MOSFET element 30, the first semiconductor layer 31 (including the second semiconductor layer 33) and the source portion 32 are comprised of a semiconductor layer (diamond semiconductor layer) formed of the diamond.

Further, in the MOSFET element 30, unlike the MOSFET element 10 (refer to FIGS. 2(*a*) and 2(*b*)) in which the source portion 12 is formed as the embedded layer, the source portion 32 is constituted as a layer laminated on the surface of the first semiconductor layer 31. The source portion 32 formed as this layer can be formed by a known method such as a plasma vapor phase deposition method or a lithography processing method.

Other than this, the matters described for the MOSFET element 10 (refer to FIGS. 2(*a*) and 2(*b*)) can be applied.

The MOSFET elements according to the first to third embodiments described above are exemplifications for explaining the outline of the present invention, and these exemplifications may be appropriately modified unless the effects of the present invention are hindered.

Moreover, although Examples of the present invention will be described below, the technical idea of the present invention is not limited to these Examples.

EXAMPLES

Example 1

A semiconductor element (planar MOSFET element) according to Example 1 was manufactured by using the diamond as a semiconductor forming material by a manufacturing method shown below. The semiconductor element according to Example 1 is manufactured according to the configuration of the planar MOSFET element 30 shown in FIG. 7.

First, a nitrogen-doped n-type diamond substrate which is cut off at a slightly inclined off-angle and whose main surface is a {111} plane (Ib-type substrate manufactured by the Russian National Technological Institute for Superhard and Novel Carbon Materials (TISNCM)) was prepared, and this substrate was used as the first semiconductor layer.

Next, a p-type semiconductor layer serving as the source portion was formed on the surface of the first semiconductor layer (a surface whose main surface was defined as the {111} plane) by a selective growth method using a metal mask. Hereinafter, a specific description will be made.

First, the surface of the first semiconductor layer was washed by boiling with a mixed solution of sulfuric acid and nitric acid, a resist material was applied onto the first semiconductor layer by spin coating, and a resist pattern was formed using a mask. After development, a metal mask material (a laminate of gold and titanium) is vapor-deposited from above the first semiconductor layer on which the resist pattern is formed, and then the resist pattern is removed by a lift-off step on the first semiconductor layer to form a metal mask pattern on the first semiconductor layer.

Next, the first semiconductor layer (substrate) on which the metal mask pattern was formed was introduced into a plasma vapor phase deposition apparatus (AX5010-1-S manufactured by Seki Technotron Co., Ltd./currently: Corns Technology Co., Ltd.). The source portion (p-type diamond semiconductor layer) was grown and formed in a region where the metal mask pattern on the surface of the first semiconductor layer was not formed.

The growth conditions were made into conditions in which hydrogen gas, methane gas and trimethylboron gas imparting p-type conductivity were taken as raw materials and respectively introduced into the plasma vapor phase deposition apparatus assuming that the flow rate of the hydrogen gas was set to 399 sccm, the flow rate of the methane gas was set to 0.8 sccm, and the flow rate of the hydrogen-diluted gas of the trimethylboron (the trimethylboron content: 1% by volume) was set to 0.8 sccm, and in which as the film forming conditions of the plasma vapor phase deposition apparatus, the plasma input power was set to 1,200 W, the pressure was set to 50 Torr, and the film forming time was set to 0.16 hours.

Next, the first semiconductor layer on which the source portion was formed was subjected to acid cleaning to remove the metal mask pattern.

Next, the first semiconductor layer in this state was heat-treated at 500° C. for 1 hour in a hydrated atmosphere to bond an OH group to the unbonded hand of one carbon atom that goes out from the {111} plane of the first semiconductor layer, and the carbon atom located on the outermost surface of the first semiconductor layer was subjected to termination treatment with an OH group. The termination treatment was performed using a tube-type electric furnace (small tube furnace manufactured by Koyo Thermo System Co., Ltd.), and the hydrated atmosphere was performed by bubbling ultrapure water with high-purity nitrogen gas.

Next, an atomic layer deposition apparatus (Oxford Instruments Co., Ltd., FlexAL) was used to form an $Al_2O_3$ insulating film as the gate insulating film on the surface of the first semiconductor layer. Incidentally, as the conditions for forming the gate insulating film in the atomic layer deposition apparatus, a film formation temperature thereof was set to 300° C., and the thickness thereof was set to 50 nm.

At the time of forming the gate insulating film, H in the OH group bonded to the carbon atom by the termination treatment and Al in the gate insulating film (the $Al_2O_3$ insulating film) are replaced with each other, and stable bonding between the carbon atom and the gate insulating film is formed. Consequently, the gate insulating film is formed on the surface of the first semiconductor layer with few defects.

Next, a resist material was applied onto the $Al_2O_3$ insulating film by spin coating, and a mask was used to form a resist pattern in a form of not covering the respective forming regions of the source electrode and the drain electrode formed in the next step. After development, it was impregnated with diluted hydrofluoric acid solution to remove the gate insulating film at a position not covered with the resist pattern, and then the resist pattern was impregnated with resist removing liquid to remove excess resist.

As a result, the forming regions of the source electrode and the drain electrode are brought into an exposed state, and the first semiconductor layer is brought into a state covered with the gate insulating film.

Next, a resist material was applied to the first semiconductor layer in such a state by spin coating, and a mask was used to form a resist pattern in a form of not covering each forming region of the source electrode and the drain electrode and the gate electrode forming region on the gate insulating film. After development, a laminated electrode of gold (100 nm)/platinum (30 nm)/titanium (30 nm) was vapor-deposited using a vacuum vapor deposition apparatus (electron beam vapor deposition device manufactured by Eiko Engineering Co., Ltd.), and then the resist pattern was removed by lift-off.

Thus, the source electrode, the drain electrode, and the gate electrode are formed by the laminated electrode, but are formed on each forming region.

As described above, the semiconductor device according to Example 1 was manufactured as the planar MOSFET element formed of the diamond semiconductor.

<Characteristics>

Figure 8:
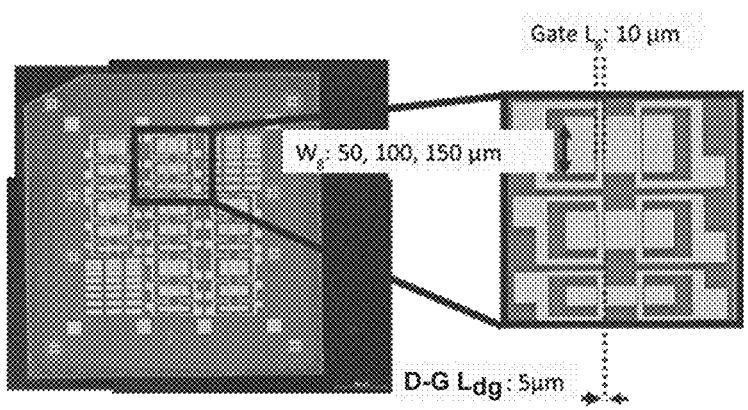
FIG. 8 is view showing an optical microscope image obtained by capturing a semiconductor device according to Example 1 from its upper surface, and showing a part of the optical microscope image in an enlarged form.

Next, the MOSFET operation of the semiconductor device according to Example 1 was confirmed. In FIG. 8, there is shown a state when the semiconductor device according to Example 1 is viewed from above. Incidentally, FIG. 8 is a view showing an optical microscope image obtained by capturing the semiconductor device according to Example 1 from its upper surface, and showing a part of the optical microscope image in an enlarged form.

As shown in the optical microscope image in FIG. 8, in the semiconductor device according to Example 1, when the line width of the gate electrode disposed linearly between the source electrode and the drain electrode is assumed to be a gate length $L_g$, and the wiring length of the gate electrode at the position sandwiched between the source electrode and the drain electrode is assumed to be a gate width $W_g$, the gate length $L_g$ is set to 10 μm and the gate width $W_g$ is set to 100 μm. Incidentally, in the semiconductor device according to Example 1, an element structure portion is also provided in which a gate length $L_g$ is set to 5 μm and 15 μm and a gate width $W_g$ is set to 50 μm and 150 μm. Further, the distance $L_{dg}$ is set to 5 μm as the distance between the drain electrode and the gate electrode.

Figure 9:
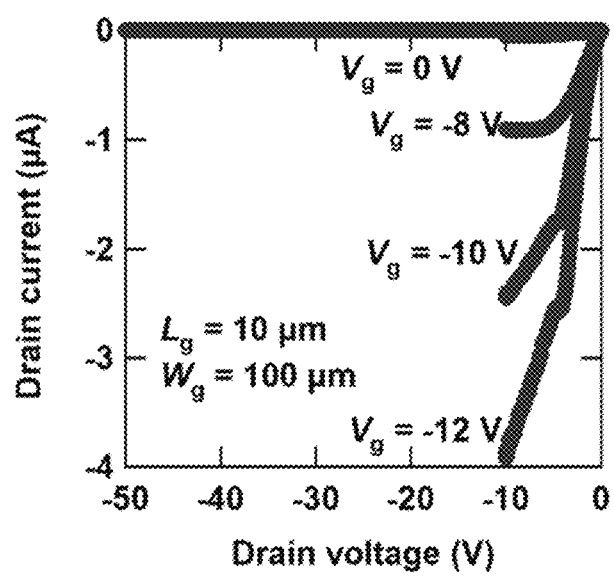
FIG. 9 is a view showing the result of having measured the device characteristics of the semiconductor device according to Example 1.

The results of measuring the device characteristics of the semiconductor device according to Example 1 using a semiconductor parameter analyzer device (4200-SCS manufactured by KEITHLEY instruments, Inc.) are shown in FIG. 9. FIG. 9 shows drain current-drain voltage characteristics when a drain voltage between the source electrode and the drain electrode is taken on the horizontal axis and a drain current flowing between the source electrode and the drain electrode is taken on the vertical axis, and a voltage $V_g$ applied to the gate electrode is changed from 0V to −12V at −2V increments.

As shown in FIG. 9, when the value of the gate voltage $V_g$ is increased (in the negative direction) from a normally off state, the characteristics in which the drain current flows are confirmed, and the semiconductor device according to Example 1 is capable of MOSFET operation.

Further, although the drain voltage when the voltage $V_g$ applied to the gate electrode is taken to be 0V has been applied by the magnitude of −200V or higher, no dielectric breakdown is generated.

The condition of the formula (1), which has been described as the condition under which the suitable MOSFET operation of the semiconductor device according to the present invention is obtained will be examined.

[Math. 3]

$$L_{dg} < \sqrt{\frac{2\varepsilon\phi_{bi}}{qN_d}} \quad (1)$$

However, in the formula (1), ε indicates a dielectric constant of the second semiconductor layer, and $\phi_{bi}$ indicates a built-in potential generated between the second semiconductor layer and the Schottky-contact drain electrode. q indicates an electron charge, and $N_d$ indicates an impurity concentration in the second semiconductor layer.

Figure 10:
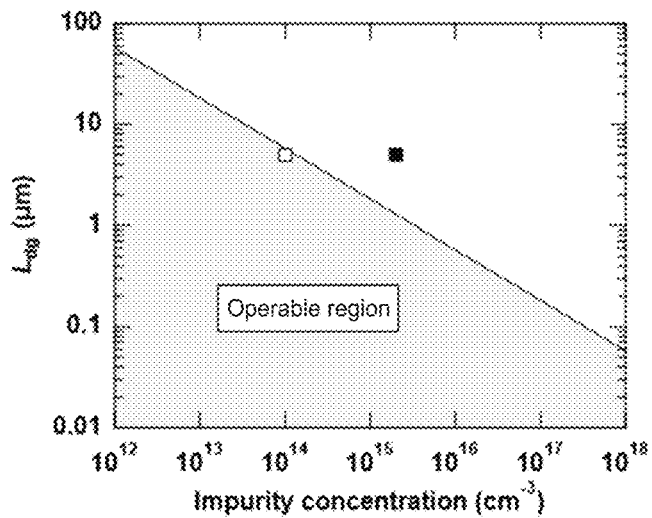
FIG. 10 is a view showing the relationship between a distance $L_{dg}$ related to a formula (1) and an impurity concentration in a second semiconductor layer.

In FIG. 10, there is shown the relationship between a distance $L_{dg}$ corresponding to the length of the depletion layer generated so as to extend from the drain electrode to the inversion layer in the second semiconductor layer when a reverse voltage of 1V is applied to the drain electrode, and the impurity concentration in the second semiconductor layer. FIG. 10 is a view showing the relationship between the distance $L_{dg}$ related to the formula (1) and the impurity concentration in the second semiconductor layer. In the figure, a region displayed in gray is a region that satisfies the condition of the formula (1), and a region displayed in white is a region that does not satisfy the condition of the formula (1).

The impurity concentration in the second semiconductor layer (first semiconductor layer itself) of the semiconductor device according to Example 1 is $1\times10^{14}$ cm$^{-3}$, and the distance $L_{dg}$ is 5 μm.

A setting condition related to the formula (1) of the semiconductor device according to Example 1 corresponds to the condition plotted in the region displayed in gray in FIG. 10 (indicated by "□" in the figure), and satisfy the condition of the formula (1).

On the other hand, except that the impurity concentration in the second semiconductor layer (first semiconductor layer itself) of the semiconductor device according to Example 1 was changed from $1\times10^{14}$ cm$^{-3}$ to $2\times10^{15}$ cm$^{-3}$, in the semiconductor device according to Reference Example manufactured in the same conditions, the setting condition related to the formula (1) corresponds to the condition plotted in the region displayed in white in FIG. 10 (indicated by "■" in the figure) and does not satisfy the condition of the formula (1).

Although it is confirmed that the semiconductor device according to Example 1 operates under the operating conditions (gate voltage, drain voltage) shown in FIG. 9, it was confirmed that the semiconductor device according to Reference Example did not operate under the operating conditions (gate voltage, drain voltage) shown in FIG. 9. For the operation of the semiconductor device according to Reference Example, it is necessary to change the voltage application condition to a larger value. On the contrary, it can be evaluated that the semiconductor device according to Example 1 can operate under a voltage application condition of a small value.

As described above, in order to suitably perform the MOSFET operation of the semiconductor device according to the present invention, it is necessary to satisfy the condition of the formula (1).

Example 2

A semiconductor element according to Example 2 was manufactured in the same manner as in Example 1 except that the distance $L_{dg}$ between the drain electrode and the gate electrode was changed from 5 μm to 2 μm by using masks different in size.

Example 3

Except that as the first semiconductor layer, a nitrogen-doped diamond substrate on which the following phosphorus-doped layer is formed is used instead of the n-type diamond substrate (Ib-type substrate manufactured by the Russian National Technological Institute for Superhard and Novel Carbon Materials (TISNCM)), and using masks of different sizes, the distance $L_{dg}$ between the drain electrode and the gate electrode is changed from 5 μm to 2 μm, the gate length $L_g$ is changed from 10 μm to 5 μm, and the gate width $W_g$ is changed from 100 μm to 150 μm, a semiconductor element according to Example 3 was manufactured in the same manner as in Example 1.

The nitrogen-doped Ib type substrate on which the phosphorus-doped layer is formed, is formed by introducing the nitrogen-doped diamond substrate (Ib-type substrate manufactured by the Russian National Technological Institute for Superhard and Novel Carbon Materials (TISNCM)) into the plasma vapor phase deposition apparatus (AX5010-1-S manufactured by Seki Technotron Co., Ltd./currently: Corns Technology Co., Ltd.) and growing a phosphorus-doped layer on this substrate as the first semiconductor layer.

The phosphorus-doped layer was formed under growing conditions in which hydrogen gas, methane gas and phosphine gas imparting n-type conductivity were taken as raw materials and respectively introduced into the plasma vapor phase deposition apparatus assuming that the flow rate of the hydrogen gas was set to 996 sccm, the flow rate of the methane gas was set to 4 sccm, and the flow rate of the hydrogen-diluted gas of the phosphine (the phosphine content; 1,000 ppm) was set to 1 sccm, and in which the plasma input power of the plasma vapor phase deposition apparatus was set to 3,600 W, the pressure was set to 150 Torr, and the film forming time was set to 1 hour.

Example 4

Except that the following hydrogen termination treatment was performed as a pretreatment for the termination treatment with the OH group and that using masks different in size, the distance $L_{dg}$ between the drain electrode and the gate electrode was changed from 2 μm to 5 μm, and the gate length $L_g$ was changed from 5 μm to 15 μm, a semiconductor element according to Example 4 was manufactured in the same manner as in Example 3.

The hydrogen termination treatment was executed by introducing the first semiconductor layer (and the nitrogen-doped diamond substrate) in a state where the metal mask pattern is removed by acid cleaning after the source portion is formed into a plasma vapor phase deposition apparatus (DCVD-901K manufactured by Arios Co., Ltd.) and introducing the same into the plasma vapor phase deposition apparatus respectively with the flow rate of the hydrogen gas as 100 sccm, and setting the plasma input power of the plasma vapor phase deposition apparatus to 600 W, the pressure condition to 30 kPa, and the processing time to 10 minutes, and then bonding hydrogen to the unbonded hand of one carbon atom that goes out from the {111} plane of the first semiconductor layer and subjecting the carbon atom located on the outermost surface of the semiconductor layer to termination treatment with hydrogen.

In the subsequent termination treatment with the OH group, the hydrogen is substituted with the OH group. Due to the atomic level roughness of the surface, the hydrogen not replaced by the OH group remains as it is and terminates dangling bond, which contributes to a reduction in the interface level density.

Figure 11:
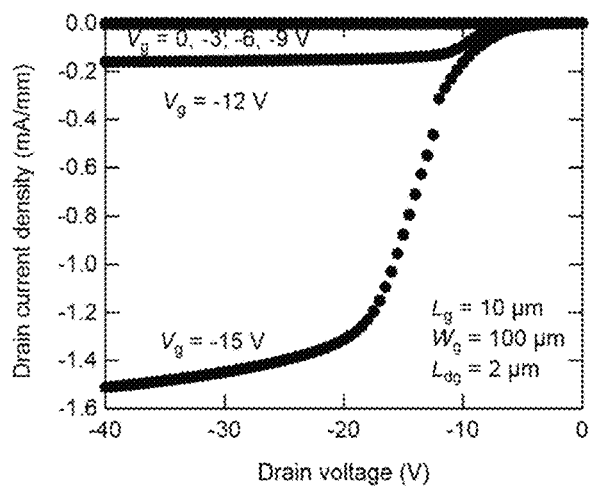
FIG. 11 is a view showing drain current-drain voltage characteristics of a semiconductor device according to Example 2.
Figure 12A:
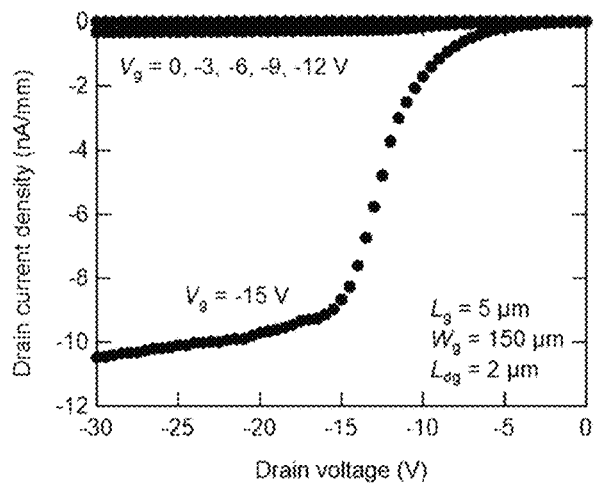
FIG. 12(a) is a view showing drain current-drain voltage characteristics of a semiconductor device according to Example 3.
Figure 12B:
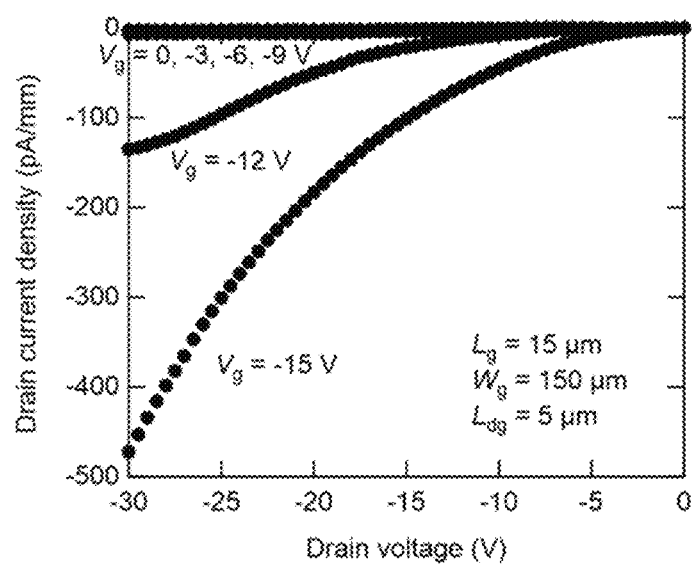
FIG. 12(b) is a view showing drain current-drain voltage characteristics of a semiconductor device according to Example 4.

Using the semiconductor parameter analyzer device (4200-SCS manufactured by KEITHLEY instruments, Inc.), the drain current-drain voltage characteristics of each of the semiconductor devices according to Example 2 to Example 4 were measured. FIG. 11 shows the on-current-on-voltage characteristics of the semiconductor device according to Example 2. Further, the drain current-drain voltage characteristics of the semiconductor device according to Example 3 are shown in FIG. 12(a). In addition, the drain current-drain voltage characteristic of the semiconductor device according to Example 4 is shown in FIG. 12(b). Incidentally, in these figures, the horizontal axis represents the voltage between the source electrode and the drain electrode as a drain voltage, and the vertical axis represents the current density of a current flowing between the source electrode and the drain electrode as a drain current. These figures show the characteristics when changing the voltage $V_g$ applied to the gate electrode to 0V to −15V at −3V increments.

As shown in FIG. 11, in the semiconductor device according to Example 2, a drain current density of a maximum of 1.5 mA/mm, which is equivalent to that of a conventional MOSFET element (refer to FIG. 1 and the like), can be obtained.

This result can be interpreted as follows.

That is, this result means that there is no resistance difference between the resistance in the drain region (refer to the drain region 103 ($p^+$-type low resistance region) in FIG. 1) in the conventional MOSFET element and the resistance in the region in which the distance $L_{dg}$ is 2 μm (refer to the second semiconductor layer 33 in FIG. 7). At the same time, this means that an internal electric field is generated in the region where the distance $L_{dg}$ is 2 μm, due to the depletion layer extending from the Schottky junction with the drain electrode (refer to the drain electrode 36 in FIG. 7) to the inversion layer (refer to the inversion layer 39 in FIG. 7), and carriers are pulled out from the inversion layer directly under the gate by this electric field, thus resulting in a state in which the resistance in the region where the distance $L_{dg}$ is 2 μm which is originally high resistance is negligible.

That is, since the semiconductor device according to the present invention can operate with a low on-resistance without arranging a drift layer with a high on-resistance (refer to the drift layer 104 in FIG. 1), it is possible to achieve both the low on-resistance and the high breakdown voltage without receiving restrictions where the relationship between the on-resistance and the breakdown voltage in the conventional MOSFET element becomes a trade-off relationship.

Further, as can be understood from the comparison of FIGS. 12(a) and 12(b), when the distance $L_{dg}$ between the drain electrode and the gate electrode is shortened from 5 μm to 2 μm, the drain voltage for turning on becomes low. In the measurement result (Example 3) of FIG. 12(a) in which the distance $L_{dg}$ is 2 μm, a saturation region of the drain current-drain voltage characteristics, which means sufficient voltage application, appears in an on-voltage range of 0V to −30V.

The results shown in FIGS. 12(a) and 12(b) can be interpreted as follows.

That is, when the distance $L_{dg}$ is too long with respect to the length of the depletion layer extending from the drain electrode (refer to the drain electrode 36 in FIG. 7) toward the inversion layer (refer to the inversion layer 39 in FIG. 7), the drain voltage for turning on increases, and the drain current also decreases sharply. Further, the voltage reaching the saturation region becomes also high. Therefore, in the measurement result (Example 4) of FIG. 12(b) in which the distance $L_{dg}$ is 5 μm, it is understood that the saturation region is not observed in an on-voltage range of 0V to −30V.

DESCRIPTION OF REFERENCE NUMERALS

10, 20, 30, 100 MOSFET element
11, 21, 31 first semiconductor layer
12, 22, 32 source portion
15, 25, 35, 105 source electrode
16, 26a, 26b, 36, 106 drain electrode
17, 27, 37, 107 gate insulating film 18, 28, 38, 108 gate electrode
19, 29a, 29b, 39, 109 inversion layer
102 source region
103 drain region
104 drift layer.

The invention claimed is:

1. A semiconductor device comprising:
a first semiconductor layer of a first conductivity type which is either a p-type or an n-type conductivity type;
a source portion arranged so as to be in contact with the first semiconductor layer and configured as a semiconductor portion of a second conductivity type different from the first conductivity type;
a source electrode arranged in ohmic contact with the source portion;
a gate electrode arranged on at least one selected from surfaces of the first semiconductor layer via a gate insulating film interposed therebetween and capable of forming by an applied electric field, an inversion layer in a region of the first semiconductor layer near the surface of the first semiconductor layer contacting the gate insulating film;
a second semiconductor layer of the first conductivity type arranged so as to be in contact with the inversion layer; and
a drain electrode separated from the inversion layer and arranged in Schottky contact with the second semiconductor layer,
wherein a distance $L_{dg}$ which is the shortest distance between the inversion layer and the drain electrode satisfies the condition of the following formula (1):

[Math. 1]
$$L_{dg} < \sqrt{\frac{2\varepsilon\phi_{bi}}{qN_d}} \quad (1)$$

where, in the formula (1), $\varepsilon$ indicates a dielectric constant of the second semiconductor layer, $\phi_{bi}$ indicates a built-in potential generated between the second semiconductor layer and the Schottky contact drain electrode, q indicates an electron charge, and $N_d$ indicates an impurity concentration in the second semiconductor layer.

2. The semiconductor device according to claim 1, wherein an impurity concentration in the source portion is one digit or more higher than an impurity concentration in the first semiconductor layer.

3. The semiconductor device according to claim 1, wherein the source portion is formed as either a layer embedded from one surface of the first semiconductor layer toward the surface side opposite to the one surface or a layer laminated on the one surface,
wherein the gate electrode is arranged on the one surface of the first semiconductor layer via the gate insulating film,
wherein the second semiconductor layer is formed at a position facing the source portion with the gate electrode and the inversion layer interposed therebetween as either a layer embedded from the one surface of the first semiconductor layer toward the surface side opposite to the one surface or a layer laminated on the one surface, and
wherein the drain electrode is arranged on the second semiconductor layer.

4. The semiconductor device according to claim 1, wherein the source portion is formed as a layer on which the source electrode is arranged on one surface of the source portion,
wherein the first semiconductor layer is formed so as to be laminated on the surface of the layer opposite to the one surface and to have a through hole passing from the laminated surface with the layer to the surface opposite to the laminated surface,
wherein the second semiconductor layer and the drain electrode are arranged in this order on the opposite surface of the first semiconductor layer, and
wherein the gate electrode is arranged in the through hole in a state in which a contact surface with the first semiconductor layer and the layer is covered with the gate insulating film.

5. The semiconductor device according to claim 1, wherein the first semiconductor layer and the second semiconductor layer are formed as one layer with the same semiconductor material and impurity concentration.

6. The semiconductor device according to claim 1, wherein at least one of the first semiconductor layer, the second semiconductor layer, and the source portion is formed of a wide-gap semiconductor forming material having a band gap larger than that of silicon.

7. The semiconductor device according to claim 6, wherein the wide-gap semiconductor forming material is diamond.

8. The semiconductor device according to claim 7, wherein the source portion is formed of diamond and has hopping conductivity.

* * * * *